United States Patent
Saito et al.

(10) Patent No.: US 8,952,415 B2
(45) Date of Patent: Feb. 10, 2015

(54) SEMICONDUCTOR LIGHT EMITTING ELEMENT, METHOD OF MANUFACTURING THE SAME, AND VEHICLE LIGHTING UNIT UTILIZING THE SAME

(71) Applicant: Stanley Electric Co., Ltd., Tokyo (JP)

(72) Inventors: Tatsuma Saito, Tokyo (JP); Mamoru Miyachi, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 13/773,610

(22) Filed: Feb. 21, 2013

(65) Prior Publication Data

US 2013/0214321 A1  Aug. 22, 2013

(30) Foreign Application Priority Data

Feb. 21, 2012 (JP) ................................. 2012-035430

(51) Int. Cl.
| | |
|---|---|
| *H01L 33/62* | (2010.01) |
| *H01L 27/15* | (2006.01) |
| *H01L 33/00* | (2010.01) |
| H01L 33/20 | (2010.01) |
| H01L 33/38 | (2010.01) |
| F21S 8/10 | (2006.01) |

(52) U.S. Cl.
CPC .............. *H01L 33/62* (2013.01); *H01L 27/153* (2013.01); *H01L 33/0079* (2013.01); *H01L 33/20* (2013.01); *H01L 33/385* (2013.01); *H01L 33/38* (2013.01); *H01L 2924/0002* (2013.01); *F21S 48/1154* (2013.01); *F21S 48/1159* (2013.01)
USPC ........................................... 257/99; 257/753

(58) Field of Classification Search
CPC ... H01L 33/0079; H01L 33/385; H01L 33/62; F21S 48/1154; F21S 48/1159
USPC ...................................... 257/99, 753
See application file for complete search history.

(56) References Cited

U.S. PATENT DOCUMENTS

| | | | | |
|---|---|---|---|---|
| 7,223,632 | B2 * | 5/2007 | Onozuka et al. .............. | 438/107 |
| 7,968,897 | B2 * | 6/2011 | Hata et al. ...................... | 257/98 |
| 2005/0157508 | A1 | 7/2005 | Takeda et al. | |

(Continued)

FOREIGN PATENT DOCUMENTS

JP  2010-56458 A  3/2010

OTHER PUBLICATIONS

European Search Report for the related European Patent No. 2631948 dated Dec. 17, 2013.

*Primary Examiner* — Allan R Wilson
(74) *Attorney, Agent, or Firm* — Kenealy Vaidya LLP

(57) ABSTRACT

There is provided a highly reliable semiconductor light emitting element and vehicle lighting unit as well as associated methods. The semiconductor light emitting element can include a support substrate, a semiconductor stacked body including a first semiconductor layer of a first conductivity type, an active layer formed on the first semiconductor layer, and a second semiconductor layer of a second conductivity type formed on the active layer. The element can further include a bonding layer configured to bond the support substrate and the semiconductor stacked body, the bonding layer having a side surface that forms an angle exceeding 90° with a surface of the bonding layer on the side of the semiconductor stacked body, and an interconnection layer configured to extend from the upper surface of the semiconductor stacked body to cover the side surface of the bonding layer.

9 Claims, 8 Drawing Sheets

(56) References Cited

U.S. PATENT DOCUMENTS

| | | |
|---|---|---|
| 2005/0167666 A1 * | 8/2005 | Onozuka et al. ............. 257/66 |
| 2006/0056123 A1 | 3/2006 | Aoyagi et al. |
| 2006/0097270 A1 | 5/2006 | Yuri |
| 2011/0127912 A1 * | 6/2011 | Lee et al. ............. 315/32 |

* cited by examiner

SEMICONDUCTOR LIGHT EMITTING ELEMENT, METHOD OF MANUFACTURING THE SAME, AND VEHICLE LIGHTING UNIT UTILIZING THE SAME

This application claims the priority benefit under 35 U.S.C. §119 of Japanese Patent Application No. 2012-035430 filed on Feb. 21, 2012, which is hereby incorporated in its entirety by reference.

TECHNICAL FIELD

The presently disclosed subject matter relates to a semiconductor light emitting element, a method of manufacturing the same, and a vehicle lighting unit utilizing the same.

BACKGROUND ART

A light emitting diode made of a nitride semiconductor such as GaN can emit ultraviolet light or blue light, and can also be configured to emit white light by using a fluorescent substance. Among such white LEDs, an LED that can emit white light with high output power is applicable for illumination purposes.

Sapphire is generally used to form a growth substrate for a nitride semiconductor. Meanwhile, a sapphire substrate has insulating properties, so that an n-electrode and a p-electrode should be formed on the same surface (growth layer side) of the substrate. Thus, an electrode pad and an interconnect line on the n side, and those on the p side should be formed in different regions. The electrode pads on the n and p sides may hinder the optical output and increase light absorbance. In general, when the electrode pads are provided on the same surface, series resistance may increase more than the case where the electrode pads are provided on opposite surfaces. This can increase the driving voltage applied to the LED. Additionally, the heat conductivity of the sapphire substrate is low, so that the sapphire substrate has poor heat dissipating properties. Thus, a sapphire substrate cannot be used suitably in a device to be supplied with a large current.

In view of these circumstances, an improved device structure has been developed in recent years. In this device structure, a sapphire growth substrate is removed by laser lift-off (LLO) or polishing to expose a nitride semiconductor layer (being an n type semiconductor layer), and an n electrode is formed on the exposed nitride semiconductor layer, thereby arranging the n electrode and a p electrode at respective opposite positions (see Japanese Patent Application Laid-Open No. 2010-056458, for example).

FIG. 1 is a schematic sectional view of the structure of a conventional nitride semiconductor light emitting element (LED element) 201.

In a process of manufacturing the LED element 201, a GaN device structure layer 202 composed of an n-type GaN layer, an active layer, and a p-type GaN layer is first formed on a transparent growth substrate made of sapphire and the like. Then, a reflective electrode 203 made of Ag and the like, and a first adhesive layer 205 are formed sequentially. The first adhesive layer 205 has a side surface vertical or forward tapered with respect to the growth substrate. Meanwhile, an Si support substrate 210 is prepared separately while an insulating layer 209 and a second adhesive layer 206 made of AuSn and the like are formed on the surface of the support substrate 210.

Next, the growth substrate is turned upside down and the first and second adhesive layers 205 and 206 are bonded to each other. This forms a fusion layer 226 so that the two substrates are bonded. Then, the growth substrate is removed by LLO. Next, an insulating film 207 is formed except for the upper surface of the device structure layer 202 exposed as a result of removal of the growth substrate and part of the fusion layer 226 to become a p electrode 212.

Then, an n electrode (extraction electrode) 211 and an interconnection electrode 208 are formed. The n electrode 211 is disposed to extend along one side of the outer circumference of the device structure layer 202 while being distanced a certain space from the device structure layer 202. The interconnection electrode 208 is disposed to extend from the upper surface (light emission surface) of the device structure layer 202 to cover a side surface of the same, thereby connecting the n type GaN layer and the n electrode 211.

Regarding the conventional LED element 201, the fusion layer 226 is formed by forming the first adhesive layer 205 so as to have a side surface vertical or forward tapered with respect to the growth substrate, turning the first adhesive layer 205 upside down, and bonding the first and second adhesive layers 205 and 206 to each other. As a result, an end face structure of the fusion layer 226 becomes vertical or reverse tapered with respect to the support substrate 210 as shown in FIG. 1 (meaning that an angle formed between the surface of the fusion layer 226 on the side of the light emission surface and the side surface of the fusion layer 226 becomes 90 degrees or smaller). Thus, the interconnection electrode 208 disposed on an edge of the fusion layer 226 (part surrounded by dashed line in FIG. 1) between the surface on the side of the light emission surface and the side surface of the fusion layer 226 may be disconnected during the manufacturing process or after the manufacture, leading to reduction of the reliability of the LED element 201.

SUMMARY

The presently disclosed subject matter was devised in view of these and other problems and features in association with the conventional art. According to an aspect of the presently disclosed subject matter, there is provided a highly reliable semiconductor light emitting element.

According to another aspect of the presently disclosed subject matter, a semiconductor light emitting element can include: a support substrate; a semiconductor stacked body composed of a first semiconductor layer of a first conductivity type, an active layer formed on or over the first semiconductor layer, and a second semiconductor layer of a second conductivity type formed on or over the active layer; a bonding layer configured to bond the support substrate and the semiconductor stacked body, the bonding layer having a side surface that forms an angle exceeding 90° with a surface of the bonding layer on the side of the semiconductor stacked body; and an interconnection layer configured to extend from the upper surface of the semiconductor stacked body to cover the side surface of the bonding layer.

According to another aspect of the presently disclosed subject matter, a vehicle lighting unit can include the semiconductor light emitting element described above as a light source; and an optical system configured to project an image of the light source with a prescribed light distribution pattern.

According to still another aspect of the disclosed subject matter, a method of manufacturing a semiconductor light emitting element can include:
 (a) preparing a growth substrate;
 (b) growing a semiconductor stacked body on or over the growth substrate, the semiconductor stacked body being composed of a first semiconductor layer of a first conductivity type, an active layer formed on or over the first semiconductor layer, and a second semiconductor layer of a second conductivity type formed on or over the active layer;

(c) forming a first bonding layer on or over the second semiconductor layer;

(d) dividing the semiconductor stacked body;

(e) preparing a support substrate;

(f) forming a second bonding layer on or over the support substrate, the second bonding layer having a side surface that forms an angle exceeding 90° with the upper surface thereof;

(g) placing the first and second bonding layers one above the other to bond the first and second bonding layers to each other, thereby forming a fusion layer;

(h) removing the growth substrate from the semiconductor stacked body;

(i) forming part of a side surface of the fusion layer including the side surface of the second bonding layer into a shape so as to form an angle exceeding 90° with the upper surface of the fusion layer; and (j) forming an interconnection electrode so as to seamlessly extend from the first semiconductor layer to the side surface of the fusion layer.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to a semiconductor light emitting element and a vehicle lighting unit and associated methods of the presently disclosed subject matter with reference to the accompanying drawings in accordance with exemplary embodiments.

Figure 1:
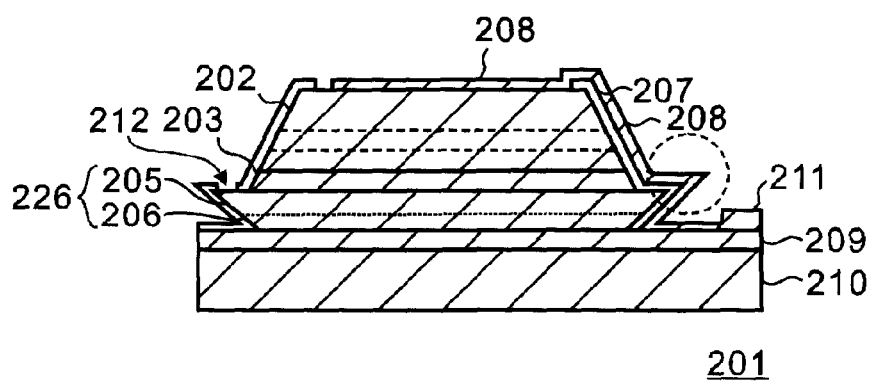
FIG. 1 is a schematic plan view of a conventional LED array 201.
Figure 2A:
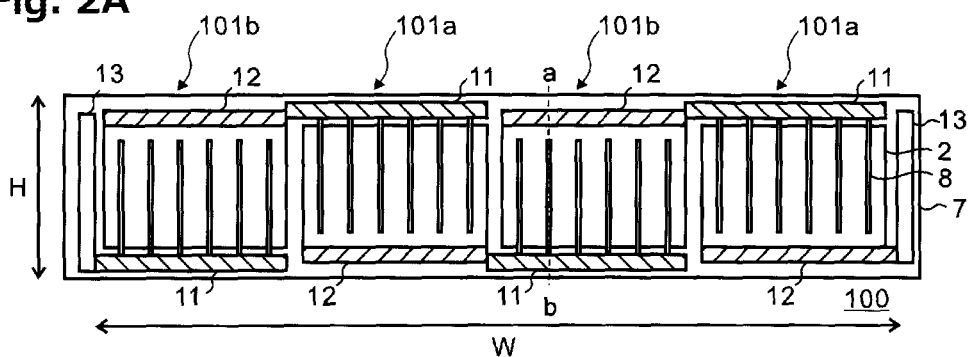
FIGS. 2A, 2B, 2C and 2D are a schematic plan view, a circuit diagram, a sectional view, and a schematic plan view of an LED array and LED elements made in accordance with principles of the presently disclosed subject matter.
Figure 2B:
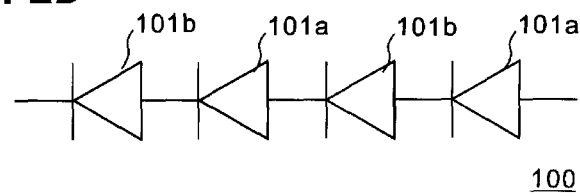
Figure 2C:
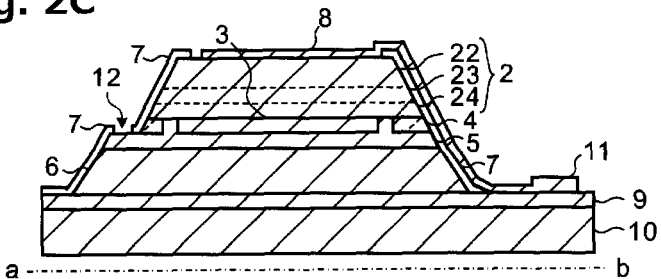
Figure 2D:
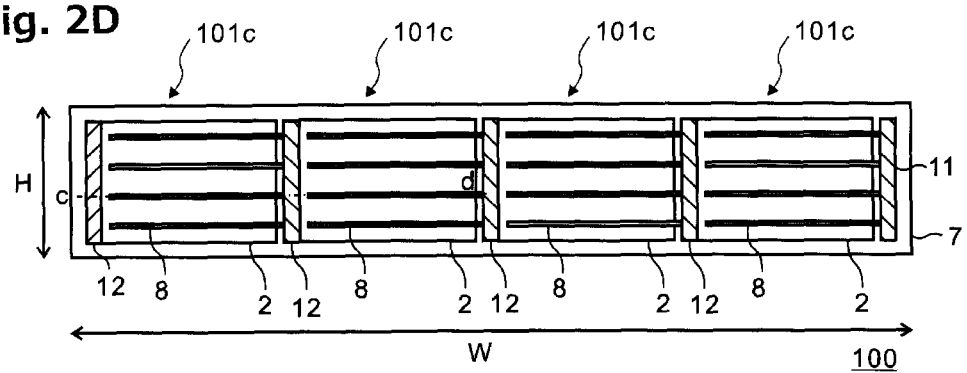

FIG. 2A is a schematic plan view of an LED array 100 of one exemplary embodiment made in accordance with the principles of the presently disclosed subject matter. FIG. 2B is an equivalent circuit diagram of the LED array 100. FIG. 2C is a simplified sectional view of the LED array 100 as viewed along a straight line a-b of FIG. 2A. FIG. 2D is a schematic plan view of a different example of the LED array 100 of the present exemplary embodiment.

The LED array 100 of the present exemplary embodiment can include series-connected four nitride semiconductor light emitting elements 101 (LED elements 101a and 101b) disposed above a support substrate (Si substrate) 10 on which an insulating layer (such as a SiO$_2$ layer or film) 9 is formed. Each of the LED elements 101 can include: a GaN light emitting part (device structure layer) 2 composed of an n-type GaN layer 22, an active layer 23, and a p-type GaN layer 24; a p-electrode 12 formed on the rear surface (surface on the side of the substrate) of the device structure layer 2 and exposed at one of upper and lower long sides of the device structure layer 2; an n-electrode (extraction electrode) 11 disposed to be parallel to and distanced a certain space away from a long side opposite the long side where the p-electrode 12 is exposed; and an interconnection electrode 8 disposed on a surface of the device structure layer 2 to be parallel to a short side of the device structure layer 2, the interconnection electrode 8 being configured to connect the n-type GaN layer 22 and the n-electrode 11.

As shown in FIG. 2B, each of the LED elements 101 can be connected in series to adjacent right and left LED elements 101. The n-electrode 11 of the LED element 101a can be electrically connected to the p-electrode 12 of the LED element 101b disposed on the left side of the LED element 101a. The p-electrode 12 of the LED element 101a can be electrically connected to the n-electrode 11 of the LED element 101b disposed on the right side of the LED element 101a. The p-electrode 12 of the LED element 101a and the n-electrode 11 of the LED element 101b disposed at edges of the LED array 100 can be connected to respective feeding pads 13 on the right and left ends of the array.

The LED elements 101a and 101b can have the same structure, with the only difference being an electrode pattern such as arrangement of the p-electrode 12, the n-electrode 11 and the interconnection electrode 8. Specifically, the electrode pattern of the LED element 101b can be formed by turning the electrode pattern of the LED element 101a upside down.

As shown in FIG. 2C, a protective film (insulating film) 7 made of SiO$_2$, for example, and having openings corresponding to regions of the upper surface (light emission surface) of the device structure layer 2 and the p-electrode 12 can be formed entirely on or over the upper surface of the element. Namely, the protective film 7 can be formed on or over the entire element surface, except for the light emission surface of the device structure layer 2 and the p-electrode 12.

The n-electrode (extraction electrode) 11 can be disposed to extend along one side of the outer circumference of the device structure layer 2 while being distanced a certain space away from the light emitting part 2. Further, the interconnection electrode 8 can be disposed to extend from the upper surface (light emission surface) to cover a side surface (part of the side surface on the protective film 7) of the device structure layer 2, thereby connecting the n-type GaN layer 22 and the n-electrode 11.

The p-electrode 12 of each of the LED elements 101 can be composed of a reflective electrode layer 3 formed on or over the rear surface (p-type GaN layer 24) of the device structure layer 2, and a first adhesive layer 5, for example. The first adhesive layer 5 can be fusion bonded to a second adhesive layer 6 formed above the support substrate 10 to form a fusion layer (including the reflective electrode layer 3 and remaining parts of an etching stop layer 4). Note that the etching stop layer 4 can function as an etching stopper in an etching step to be described later with reference to FIGS. 6A and 6B.

In the present exemplary embodiment of the disclosed subject matter, the second adhesive layer 6 can be formed above the support substrate 10 so that an angle θ1 (see FIG. 4C) formed between a surface (upper surface) thereof to be bonded to the first adhesive layer 5 and a side surface thereof is an obtuse angle (θ1>90°), and an angle θ2 of the side surface thereof with respect to the support substrate 10 is always in a range of an acute angle (0°<θ2<90°). (Note that the horizontal sectional area of the second adhesive layer 6 can increase with a decreasing distance to the support substrate 10 so that the second adhesive layer 6 becomes forward tapered with respect to the support substrate 10, for example, and that this shape is hereinafter called simply as a "forward-tapered shape", or a "shape where the side surface expands with a decreasing distance to the support substrate 10.")

Additionally, after the first and second adhesive layers 5 and 6 are fusion bonded, the first adhesive layer 5 can be formed into a shape in which the upper surface (surface on the side of the device structure layer 2) and a side surface of the first adhesive layer 5 form an angle exceeding 90° (shape where the side surface expands with a decreasing distance to the support substrate 10), which will be described later. As a result of this shape formation, the area of the lower surface (surface bonded to the second adhesive layer 6) of the first adhesive layer 5 becomes the same as, about the same as or smaller than that of the upper surface of the second adhesive layer 6. Thus, a side surface of the fusion layer composed of the first and second adhesive layers 5 and 6 can be configured to expand continuously or stepwise toward the support substrate 10 as viewed in the vertical section of the fusion layer.

In one embodiment, the insulating layer 9 on the support substrate 10 be removed partially during shape formation of the first adhesive layer 5, thereby achieving a shape where the upper surface and a side surface of the stacked body composed of the first and second adhesive layers 5 and 6 and the insulating layer 9 form an angle exceeding 90° (shape where the side surface expands with a decreasing distance to the support substrate 10).

In the present exemplary embodiment, at least the shape of the fusion layer composed of the first and second adhesive layers 5 and 6 can be determined such that the upper surface (surface on the side of the device structure layer 2) and the side surface of the fusion layer form an angle exceeding 90° (shape where the side surface expands with a shorter distance to the support substrate 10). This configuration can eliminate an acute angle part in a surface of the fusion layer where the interconnection layer 8 is to be formed, making it possible to prevent disconnection of the interconnection layer 8.

The shape of the fusion layer composed of the first and second adhesive layers 5 and 6 may be determined such that only the side surface of the fusion layer where the interconnection layer 8 is to be formed expands with a shorter distance to the support substrate 10. The side surface of the fusion layer composed of the first and second adhesive layers 5 and 6 where the interconnection layer 8 is to be formed does not necessarily expand continuously, but it may expand stepwise with a shorter distance from the support substrate 10. In either case, formation of an acute angle part in the surface of the fusion layer where the interconnection layer 8 is to be formed should be prevented. The insulating layer 9 may also be formed into a shape where a side surface thereof expands with a shorter distance to the support substrate 10. In this case, it is also desirable that formation of an acute angle part in a surface of the insulating film 9 where the interconnection layer 8 is to be formed be prevented. Regarding formation of a layer except the aforementioned layers, it is also desirable to prevent formation of an acute angle part in a surface of this layer where the interconnection layer 8 is to be formed.

Note that the arrangement of the LED elements 101a and 101b of the LED array 100 is not only configured by placing the LED elements 101a and 101b alternately. Only the LED elements 101a or 101b may be arranged to form the LED array 100. The number of the LED elements 101 is not limited to four. Further, some of or all of the LED elements 101 of the LED array 100 may be connected in parallel, if necessary. Additionally, the LED elements 101 are not necessarily laid out horizontally, but they may be laid out in a matrix shape with a plurality of rows and a plurality of columns.

Each of the LED elements 101 may be horizontally long, square, or in a different shape. As shown in FIG. 2D, if horizontally long LED elements 101c are used, it is desirable that the n-electrode 11 and the p-electrode 12 each be disposed between adjacent elements.

The shape in plan view of the interconnection layer 8 is not limited to a comb-like shape as shown in the drawings, but it may be various shapes such as a ladder shape and a radial shape.

A method of manufacturing the LED elements 101 of the present exemplary embodiment of the disclosed subject matter will next be described with reference to FIGS. 3A to 3E, 4A to 4D, 5A to 5C, 6A to 6C, and 7A and 7B. The series-connected horizontally long LED elements 101c shown in FIG. 2D disposed along long sides of the LED elements 101c will be described as examples of the LED elements 101 to be manufactured. The LED elements 101a and 101b shown in FIG. 2A, or an LED element 101 of a different shape can be manufactured by the same method as they only differ from the LED elements 101c in the positions where the p-electrode 12, the n-electrode 11 and the interconnection electrode 8 are formed and in the shape of each component.

FIGS. 3A to 3E, 4A to 4D, 5A to 5C, 6A to 6C, and 7A and 7B are schematic sectional views taken along line c-d of FIG. 2D, so that they show only two nitride semiconductor light emitting elements (LED elements) 101c. Meanwhile, in the example described below, four LED elements 101c are formed simultaneously in a line on the same substrate. The following manufacturing method is described only as an example and the presently disclosed subject matter is not limited thereto. For example, each of the method steps can be executed consecutively or can be executed in different order, simultaneously, partially simultaneously, at different locations and/or different times, etc.

Figure 3A:
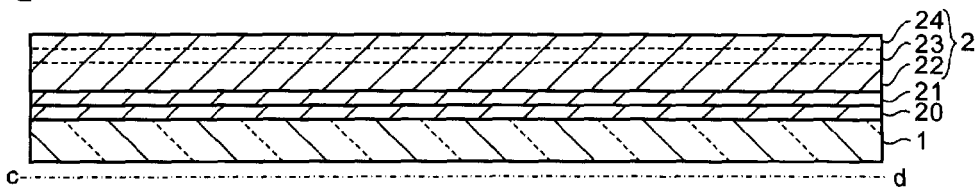
FIGS. 3A to 3E, 4A to 4D, 5A to 5C, 6A to 6C, and 7A and 7B are schematic sectional views each showing a method of manufacturing the LED array made in accordance with principles of the presently disclosed subject matter.

First, as shown in FIG. 3A, a growth substrate 1 made of sapphire is prepared, and a device structure layer 2 (being a GaN light emitting part) made of a nitride semiconductor is formed on the growth substrate 1 by a metal organic chemical vapor deposition (MOCVD) process. More specifically, the sapphire substrate 1 is introduced into an MOCVD apparatus, and then thermal cleaning is performed. After a GaN buffer layer 20 and an undoped GaN layer 21 are grown, an n-type GaN layer 22 doped with Si and the like and having a thickness of about 5 μm, a multiple quantum well light emitting layer (active layer) 23 including an InGaN quantum well layer, and a p-type GaN layer 24 doped with Mg and the like and having a thickness of about 0.5 μm, are grown sequentially to form the GaN device structure layer 2. The growth substrate 1 is a single-crystalline substrate having a lattice constant that allows epitaxial growth of GaN. To allow later removal of the substrate 1 by laser lift-off, the material of the growth substrate 1 is selected from those being transparent to light with a wavelength of 362 nm being an absorption edge wavelength of GaN. Examples of material that can be utilized for the substrate 1 can include, in addition to sapphire, spinel, SiC, and ZnO.

Figure 3B:
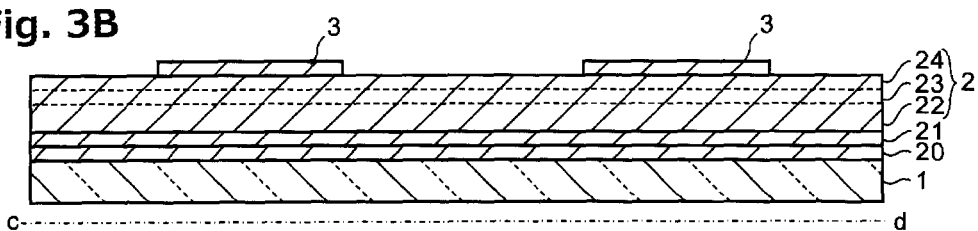
Figure 3C:
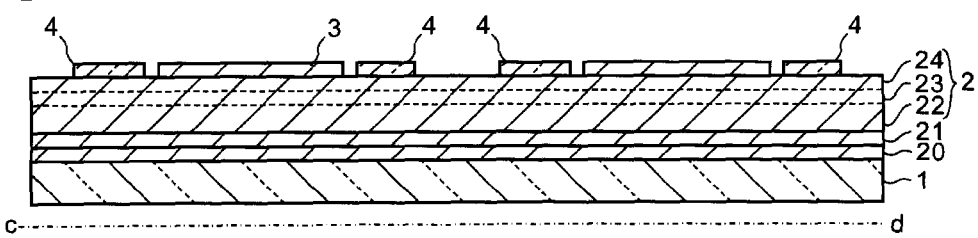

Next, as shown in FIG. 3B, an Ag layer of a thickness of 200 nm is formed by electron beam deposition process on a surface (surface of the p-type GaN layer 24) of the device structure layer 2. Then, the Ag layer is patterned by process such as lift-off to form a p-electrode layer (reflective electrode layer) 3 with a prescribed shape. Examples of the material of the reflective electrode layer 3 may include Ag, Pt, Ni, Al, Pd, and alloys of these materials. Next, as shown in FIG. 3C, an etching stop layer 4 made of $SiO_2$ is formed by a sputtering process to the same thickness as the reflective electrode layer 3 on the device structure layer 2 (on the p-type GaN layer 24) to surround the reflective electrode layer 3. The etching stop layer 4 can function as an etching stopper in an etching step to be described later by referring to FIGS. 6A and 6B.

Figure 3D:
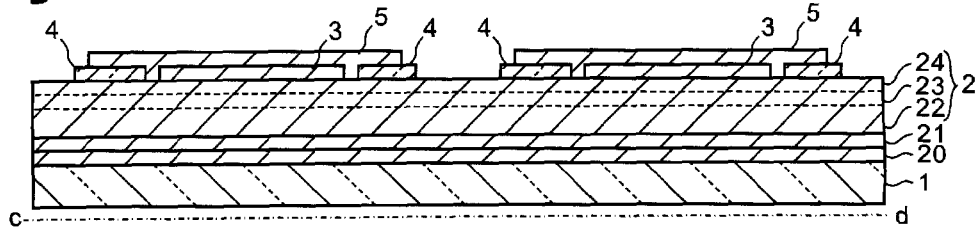

Next, as shown in FIG. 3D, a first adhesive layer 5 made of Au is formed by a sputtering process to a thickness of 200 nm in a region including the reflective electrode layer 3 and the etching stop layer 4. The first adhesive layer 5 may be formed in the region including the reflective electrode layer 3 and the etching stop layer 4 after layers such as an anti-diffusion layer and an insulating layer are formed in this region. Regarding formation of the layers such as the anti-diffusion layer and the insulating layer, an anti-diffusion layer made of TiW is formed by sputtering process to a thickness of 300 nm, for example. The anti-diffusion layer is provided to prevent diffusion of a material used in the reflective electrode layer 3. If the reflective electrode layer 3 contains Ag, the anti-diffusion layer may be made of a material selected from Ti, W, Pt, Pd, Mo, Ru, Ir and Au, and alloys of these materials. It is preferable that the insulating layer made of $SiO_2$ be formed by a process such as chemical vapor deposition (CVD) on the anti-diffusion layer.

Figure 3E:
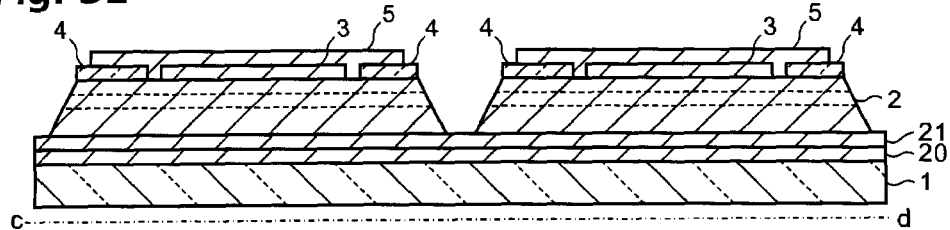

Next, as shown in FIG. 3E, the device structure layer 2 is divided into a plurality of rectangular elements (see the plan view of FIG. 2D) by a dry etching process using a resist mask and a chlorine gas. Side surfaces of the divided device structure layer 2 are forward tapered with respect to the growth substrate 1.

Figure 4A:
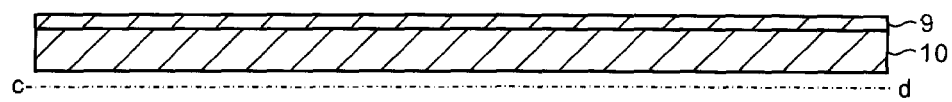

Next, as shown in FIG. 4A, a support substrate 10 made of Si is prepared, and is thermally oxidized to form an insulating layer (thermally oxidized $SiO_2$ film) 9 on a surface of the support substrate 10. The thickness of the insulating layer 9 may be any thickness that can reliably maintain insulating properties.

Then, a second adhesive layer 6 made of AuSn (Sn: 20 wt %) is formed on the insulating film 9 by a resistance heating deposition process to a thickness of 1 μm. It is desirable that the support substrate 10 be made of a material having a thermal expansion coefficient close to that of sapphire ($7.5 \times 10^{-6}$/K) or GaN ($5.6 \times 10^{-6}$/K) and high heat conductivity. Examples of the applicable material of the support substrate 10 may include Si, AlN, Mo, W, and CuW. The first and second adhesive layers 5 and 6 can be made of metals allowing fusion bonding, or a metal such as Au allowing diffusion bonding. Examples of these metals include Au—Sn, Au—In, Pd—In, Cu—In, Cu—Sn, Ag—Sn, Ag—In, and Ni—Sn, in addition to Au.

Figure 4B:
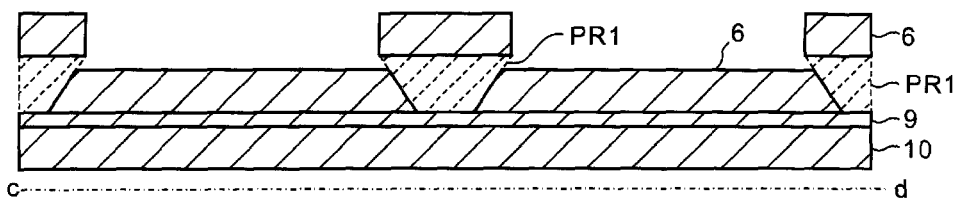
Figure 4C:
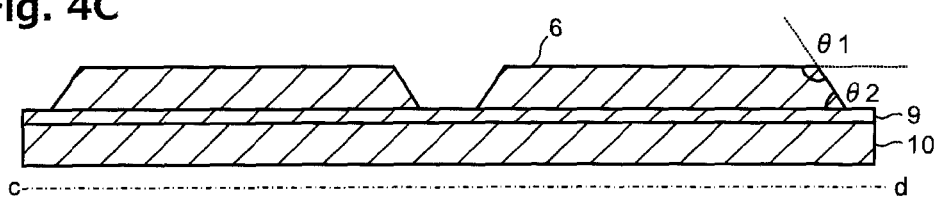

As shown in FIGS. 4B and 4C, for example, the second adhesive layer 6 can be formed by a lift-off process. First, a photoresist (such as photoresist AZ5200, available from Clariant Co., Ltd.) is applied to the entire surface of the thermally oxidized support substrate 10 (surface of the support substrate 10 on which the insulating layer 9 is formed). Then, the photoresist is pre-baked in the atmosphere for about 90 seconds by using a hot plate set to have a temperature of 90° C. or less. Next, the photoresist is patterned by being exposed with UV rays with the amount of initial exposure of 17 mJ. The exposed photoresist is subjected to reversal bake for about 90 seconds in the atmosphere at a temperature of 120° C. to thermally cross-link the exposed part. Next, UV rays are applied to the entire surface of the support substrate 10 with the amount of reversal exposure of 600 mJ. Then, the photoresist is immersed in a developer for 130 seconds for development, thereby forming a desired photoresist pattern PR1 (in part of the metal stacked layer 6 except the part thereof to become the second adhesive layer 6). The photoresist pattern PR1 thereby formed has a peripheral part that is reverse tapered with respect to the support substrate 10. Note that the resist to be used and the condition of photolithography can be changed appropriately.

Next, a metal stacked layer 6 composed of Ti (150 nm)/Ni (50 nm)/Au (100 nm)/Pt (200 nm)/AuSn (1000 nm, 20% by weight of Sn) is deposited by a resistance heating deposition process, and then subjected to lift-off. This configuration can form the second adhesive layer 6 having an edge tapered with respect to the support substrate 10, as shown in FIG. 4C. The shape of the second adhesive layer 6 is not limited to the forward tapered shape shown in the drawings, as long as the shape thereof is configured such that an angle θ1 between a surface (upper surface) to be bonded to the first adhesive layer 5 and a side surface of the second adhesive layer 6 is an obtuse angle (θ1>90°), while an angle θ2 of the side surface of the second adhesive layer 6 with respect to the support substrate 10 is always in a range of an acute angle (0°<θ2<90°).

Figure 4D:
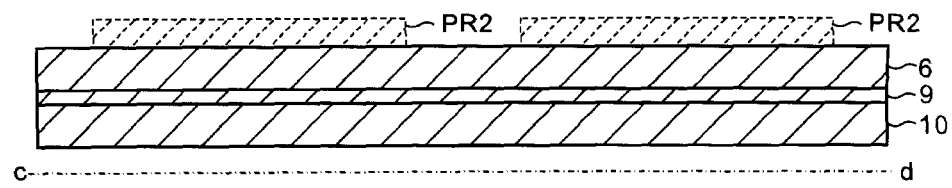

The second adhesive layer 6 can be formed by dry etching process instead of lift-off process. In this case, as shown in the example of FIG. 4D, a metal stacked layer 6 composed of Ti (150 nm)/Ni (50 nm)/Au (100 nm)/Pt (200 nm)/AuSn (1000 nm, 20% by weight of Sn) is deposited by a resistance heating deposition process to the entire surface of the thermally oxidized support substrate 10 (being a support substrate 10 on which the insulating layer 9 has been formed). Then, a photoresist (such as photoresist AZ6130, available from Clariant Co., Ltd.) is applied on the entire surface of the metal stacked layer 6, and is pre-baked in the atmosphere for about 120 seconds by using a hot plate set to have a temperature of 110° C. or less. Next, the photoresist is patterned by being exposed with UV rays with the amount of exposure of 300 mJ. Then, the photoresist is subjected to degassing in the atmosphere for about 10 minutes and then immersed in a developer for 70 seconds for development, thereby forming a desired photoresist pattern PR2 (covering part of the metal stacked layer 6 to become the second adhesive layer 6). Next, by using a reactive ion etching (RIE) apparatus, the metal stacked layer 6 exposed from the resist mask pattern (photoresist pattern PR2) is etched to an interface with the insulating layer 9 to remove and pattern the metal stacked layer 6, thereby forming the second adhesive layer 6 as shown in FIG. 4C. Note that for the dry etching, Ar, $Cl_2$ and $CF_4$ are used, and are mixed at a mixture ratio optimum for the composition of the metal stacked layer 6.

The second adhesive layer 6 can be formed by a wet etching process instead of the aforementioned processes. In this case, like in the formation by dry etching process, a metal stacked layer 6 composed of Ti (150 nm)/Ni (50 nm)/Au (100 nm)/Pt (200 nm)/AuSn (1000 nm, 20% by weight of Sn) is first deposited by resistance heating deposition process. Then, a photoresist (such as photoresist OFPR, available from TOKYO OHKA KOGYO CO., LTD.) is applied on the entire surface of the metal stacked layer 6, and is baked in the atmosphere for about 90 seconds by using a hot plate set to have a temperature of 110° C. or less. Next, the photoresist is patterned by being exposed with UV rays with the amount of exposure of 60 mJ. The photoresist is thereafter immersed in a developer for 90 seconds for development, thereby forming a desired photoresist pattern PR2 (covering part of the metal stacked layer 6 to become the second adhesive layer 6) (see FIG. 4D). Next, the metal stacked layer 6 exposed from the resist mask pattern (photoresist pattern PR2) is etched with an etchant (such as an aqueous solution of iodide and ammonium iodide for etching of Au) to an interface with the insulating layer 9 to remove and pattern the metal stacked layer 6, thereby forming the second adhesive layer 6 shown in FIG.

4C. An etchant optimum for the composition of the metal stacked layer 6 is appropriately used.

Figure 5A:
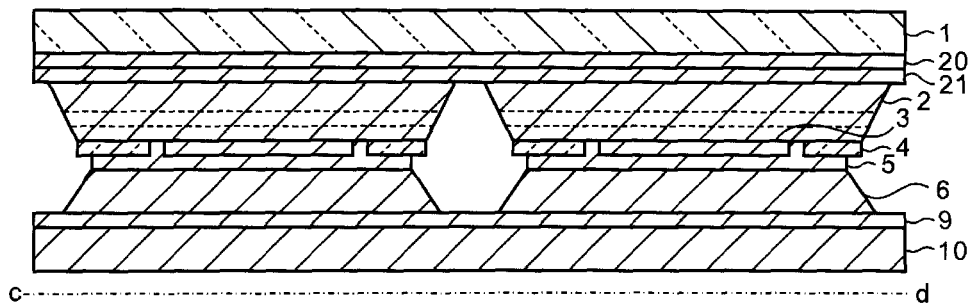

Next, as shown in FIG. 5A, the first and second adhesive layers 5 and 6 are fusion bonded by the following procedures. Specifically, they are made to contact each other, and heated to a temperature of 300° C. while being pressed under a pressure of 3 MPa and maintained in this condition for 10 minutes. Then, the first and second adhesive layers 5 and 6 are cooled to room temperature. In this manner, a fusion layer can be formed by fusion bonding.

Figure 5B:
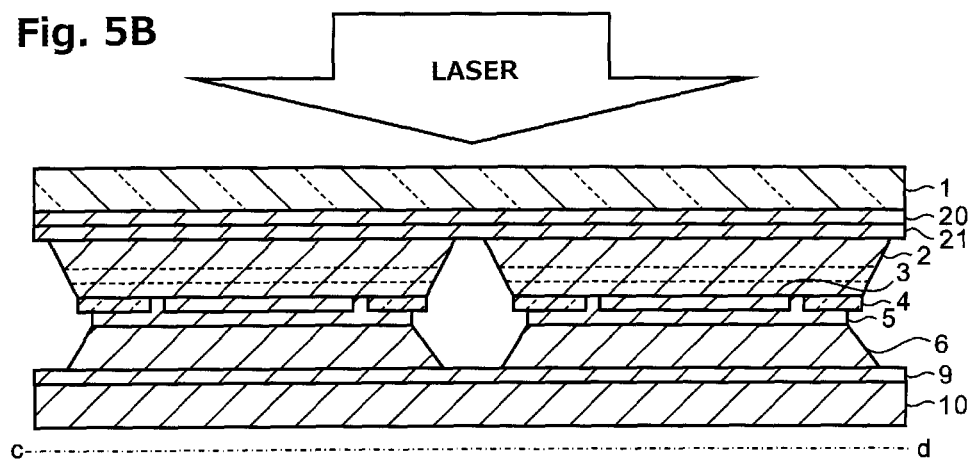

Next, as shown in FIG. 5B, light from an UV excimer laser is applied through the rear surface of the sapphire substrate 1 to decompose the buffer layer 20 with heat, thereby removing the sapphire substrate 1 by laser lift-off. The sapphire substrate 1 may be exfoliated or removed by different processes, such as by etching.

Figure 5C:
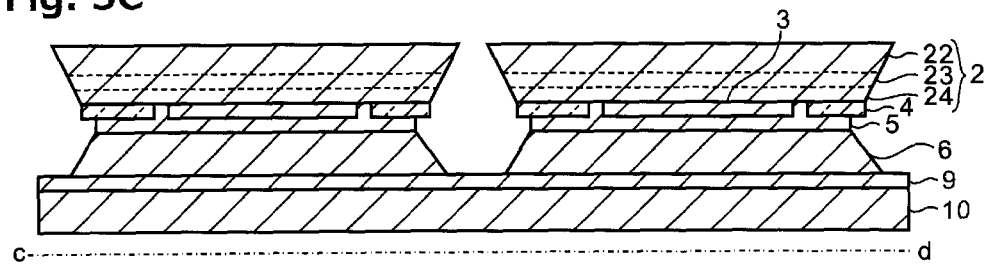

Next, as shown in FIG. 5C, Ga generated as a result of the laser lift-off is removed in hot water, for example, and a surface treatment with hydrochloric acid follows, thereby exposing the n-type semiconductor layer 22. The surface treatment may be performed by any methodology that can etch the nitride semiconductor. Chemicals such as acids and alkalis including phosphoric acid, sulfuric acid, KOH and NaOH are applicable to the surface treatment. The surface treatment may be performed by dry etching with Ar plasma or chlorine-based plasma, or by polishing. The surface of the n-semiconductor layer 22 is further treated with Cl or Ar by using a dry etching apparatus such as an RIE apparatus or smoothed by using a CMP apparatus to remove a laser scar or a laser-damaged layer. In order to enhance light extraction efficiency, the exposed surface of the n-type semiconductor layer 22 may be given recesses and projections (may be given a light extraction structure).

Figure 6A:
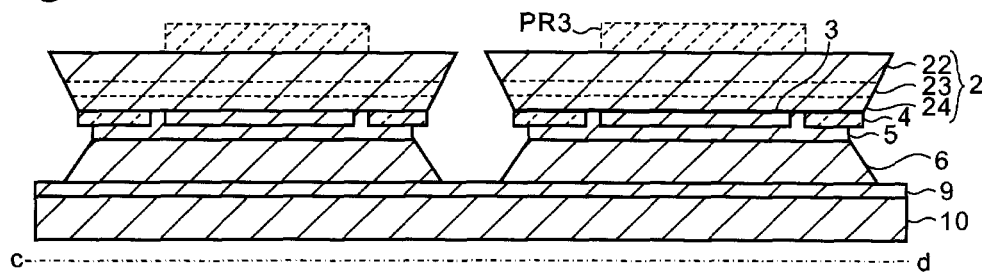
Figure 6B:
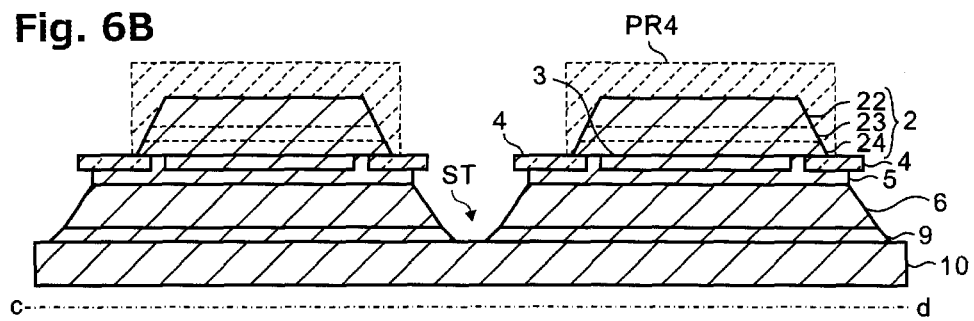

Next, as shown in FIG. 6A, a photoresist PR3 is formed so as to expose edges of the device structure layer 2. Then, the edges of the device structure layer 2 exposed from the photoresist PR3 are etched by a dry etching process with chlorine gas until the etching stop layer 4 is exposed. As a result, as shown in FIG. 6B, a side wall of the device structure layer 2 is formed into a tapered shape where the sectional area of the device structure layer 2 is reduced toward an upper side (forward-tapered shape with respect to the support substrate 10) while the support substrate 10 is placed at the bottom. In this step, the etching stop layer 4 functions as a mask, so that the insulating layer 9 on the surface of the support substrate 10 is also etched to be forward tapered with respect to the support substrate 10. Forming the etching stop layer 4 enhances the reliability of the element for the reason below. In the absence of the etching stop layer 4, the first adhesive layer 5 is etched with chlorine gas, and a deposited material of the first adhesive layer 5 generated as a result of the etching adheres to the device structure layer 2. This may become a cause of a short-circuit.

Figure 6C:
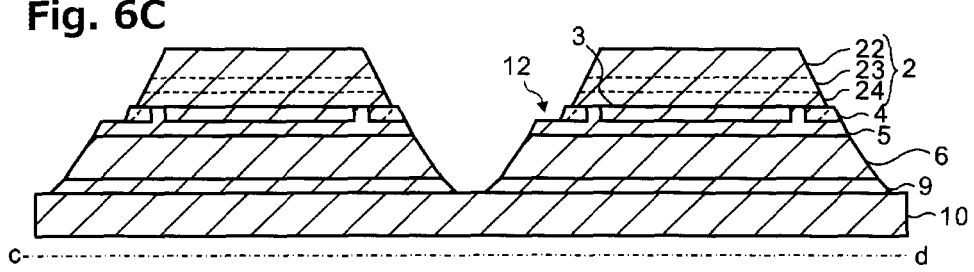

Next, as shown in FIG. 6C, the etching stop layer 4 and the first adhesive layer 5 are etched to expose an electrode part 12 for interconnection between elements. Like in the etching step of the second adhesive layer 6 described with reference to FIG. 4D, for example, this etching step can be performed by forming a mask pattern PR4 (see FIG. 6B) with a photoresist, and employing a wet etching or dry etching process. Dry etching with $CF_4$ gas is applicable, for example.

The mask pattern PR4 is formed so as to cover the upper surface and the side surface of the device structure layer 2, and to slightly cover the upper surface of the etching stop layer 4. This process can form the fusion layer composed of the first and second adhesive layers 5 and 6 (and including the reflective electrode layer 3 and remaining a parts of the etching stop layer 4) into a shape in which the upper and side surfaces of the fusion layer form an angle exceeding 90°, and the side surface of the fusion layer does not include part that forms an angle of 90° or more with respect to the support substrate 10. As a result, a stacked structure from the device structure layer 2 at the top to the insulating layer 9 at an interface with the support substrate 10 is formed into a continuously tapered shape, so that a side surface of the stacked structure on the support substrate 10 does not include a part that forms an angle exceeding 90° with respect to the support substrate 10.

Figure 7A:
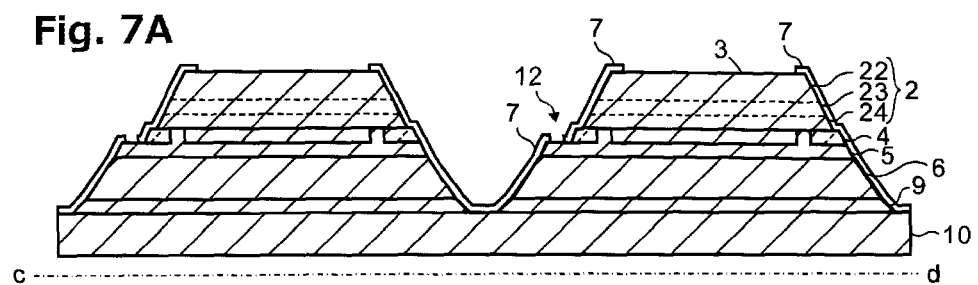

Next, as shown in FIG. 7A, a protective film (insulating film) 7 made of $SiO_2$ is formed, for example, by chemical vapor deposition (CVD) on the entire upper surface of the element formed as a result of the aforementioned steps. Then, part of the protective film 7 on the device structure layer 2 and part of the protective film 7 on the electrode part 12 are etched with buffered hydrofluoric acid to expose part of the surface of the device structure layer 2 (surface of the n-type GaN layer 22) having been exposed as a result of the removal of the growth substrate 1 and the electrode part 12.

Figure 7B:
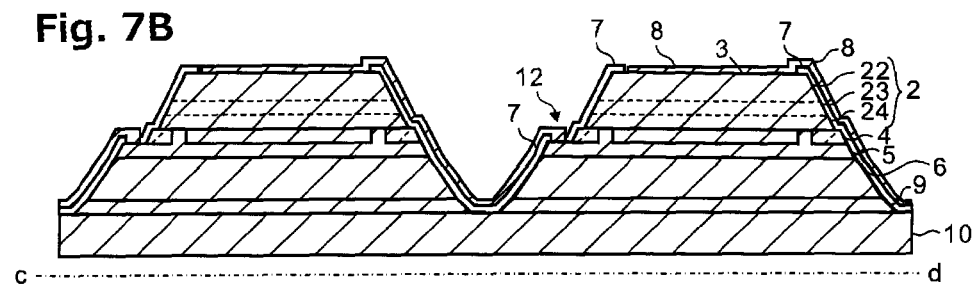

Next, as shown in FIG. 7B, a Ti layer with a thickness of 1 nm, an Al layer with a thickness of 200 nm, a Ti layer with a thickness of 100 nm, and an Au layer with a thickness of 2 μm are stacked in this order by electron beam deposition process, and are patterned by lift-off. This can simultaneously form the n-electrode 11, the p-electrode 12, and the interconnection electrode 8. In this case, the n-electrode 11 can be formed on the insulating layer 9 on the first end side of the LED array as shown in FIG. 2D (right end in the drawing), like the cross-sectional structure shown in FIG. 2C. Further, the p-electrode 12 can be formed on the first adhesive layer 5 between the adjacent elements at the other end side of the LED array opposite to the first end side as shown in FIG. 2D (left end in the drawing), like the cross-sectional structure shown in FIG. 2C. The interconnection electrode 8 can connect the n-type GaN layer 22 and the p-electrode 12 of the respective element 101c as shown in FIG. 2D. Specifically, the interconnection electrode 8 is formed so as to seamlessly cover the upper surface of the n-type GaN layer 22, the forward tapered side surface of the device structure layer 2 and the forward tapered side surface of the fusion layer composed of the first and second adhesive layers 5 and 6, while the insulating protective film 7 is placed between the interconnection electrode 8 and these side surfaces. The interconnection electrode 8 forms an Ohmic contact with the n-type GaN layer 22 in an upper surface region of the n-type GaN layer 22 where the interconnection electrode 8 and the n-type GaN layer 22 are in contact with each other. The interconnection electrode 8 is formed on a plane surface or a forward tapered surface, so that it can be disposed without being disconnected during the manufacturing steps or after manufacture. In one embodiment, the interconnection electrode 8 can have a line width of 3 μm or more and 20 μm or less.

Next, the support substrate 10 is divided by laser scribing or dicing along the outer periphery of the LED array as shown in FIG. 2D, thereby forming the LED array 100 with a plurality of nitride semiconductor light emitting elements 101c. Note that in order for the blue GaN light emitting element to emit white light, a fluorescent substance (such as a phosphor emitting yellow light by excitation) may be used in a sealing resin for sealing the light emitting element.

The element structures (including the device structure layers 2 and the fusion layers composed of the first and second adhesive layers 5 and 6) above the support substrates 10 may also be formed such that only one or only two side surfaces of each of the element structures where the interconnection electrode 8 is to be formed are processed to be slanting surfaces that expand outward toward a lower side.

Figure 8A:
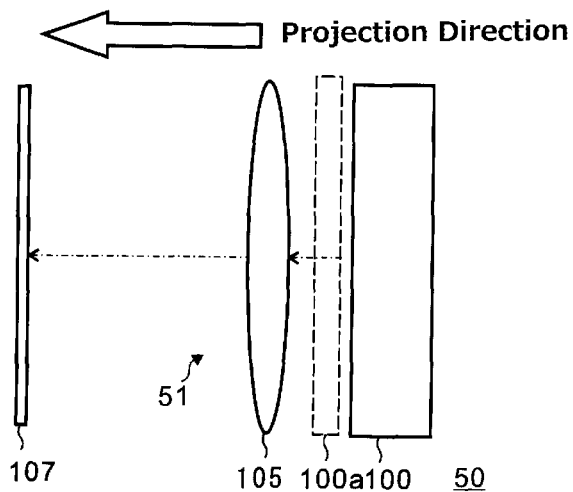
FIGS. 8A and 8B are conceptual views each showing the structure of a vehicle lighting unit (headlamp) to which an LED array made in accordance with principles of the presently disclosed subject matter is incorporated.
Figure 8B:
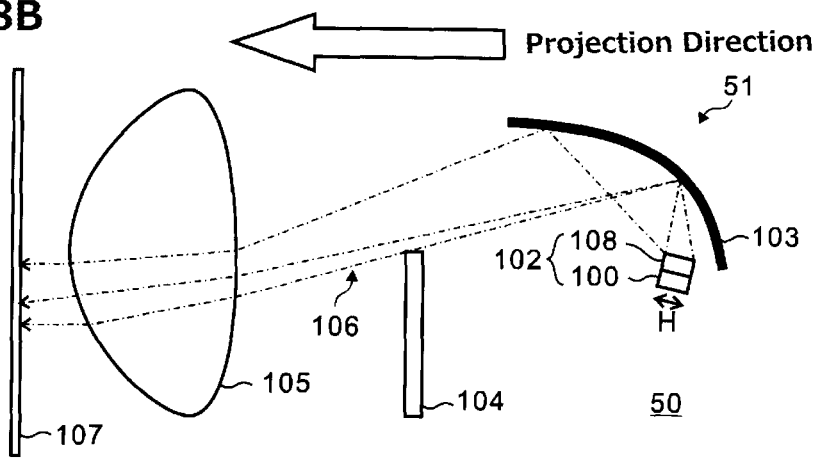

FIGS. 8A and 8B are conceptual views each showing the structure of a vehicle lighting unit (headlamp) 50 to which the LED array 100 of the present exemplary embodiment is incorporated.

FIG. 8A shows an example where an irradiation lens 105 is used as an irradiation optical system 51. The irradiation lens 105 can be configured such that an image 106 of the LED array 100 as a light source is projected onto a virtual vertical screen (irradiation surface) 107 disposed in front of the front end of a vehicle body.

The irradiation optical system 51 may include a multi-reflector (reflection surface) 103 and the irradiation lens 105, as shown in FIG. 8B. The headlamp 50 shown in FIG. 8B can include a light source 102 composed of the LED array 100 and a phosphor layer (wavelength conversion layer) 108 arranged so as to cover the light emission surface of the LED array 100, and the irradiation optical system 51 composed of the reflection surface 103 being a multi-reflector divided into a plurality of small reflection regions, a shade 104, and the irradiation lens 105.

As shown in FIG. 8B, the light source 102 can be disposed such that light is emitted upward (such that the light emission surface faces upward). The reflection surface 103 can be a reflection surface of ellipsoid of revolution having a first focal point determined at or near the light source 102, and a second focal point determined at or near the upper edge of the shade 104. The reflection surface 103 can be disposed so as to cover a range extending from a lateral side toward the front side of the light source 102, thereby allowing light from the light source 102 to enter the reflection surface 103.

As shown in FIG. 8B, the reflection surface 103 can be configured such that the image 106 of the LED array 100 of the light source 102 is projected forward of the vehicle in a predetermined light distribution pattern to be projected onto the virtual vertical screen (irradiation surface) 107 in front of the front end of the vehicle body.

The shade 104 is a light-shielding member to form a cutoff line suitable for a headlamp by shielding part of light reflected from the reflection surface 103. The shade 104 can be disposed between the irradiation lens 105 and the light source 102 while the upper edge of the shade 104 is positioned at or near the focal point of the irradiation lens 105.

The irradiation lens 105 can be disposed to be close to the front of the vehicle body, and can project light reflected from the reflection surface 103 onto the irradiation surface 107.

As described above, according to the present exemplary embodiment of the presently disclosed subject matter, the fusion layer composed of the first and second adhesive layers 5 and 6 (and including the reflective electrode layer 3 and the etching stop layer 4) can have a shape where an angle formed between the upper and side surfaces of the fusion layer exceeds 90°, and the angle θ2 of the side surface of the fusion layer with respect to the support substrate 10 is always smaller than 90°. This prevents disconnection of the interconnection layer 8 arranged on the fusion layer, thereby making it possible to provide a highly reliable semiconductor light emitting element.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. An LED array comprising a plurality of nitride semiconductor elements connected in series, the nitride semiconductor elements including:
    a support substrate;
    a semiconductor stacked body having a first semiconductor layer of a first conductivity type, an active layer formed on the first semiconductor layer, and a second semiconductor layer of a second conductivity type formed on the active layer;
    an insulating layer between the support substrate and the semiconductor stacked body;
    a bonding layer configured to bond the insulating layer and the semiconductor stacked body, the bonding layer having a side surface that forms an angle exceeding 90° with a surface of the bonding layer on the side of the semiconductor stacked body; and
    an interconnection layer configured to extend from the upper surface of the semiconductor stacked body to cover the side surface of the bonding layer.

2. The LED array of claim 1, wherein the semiconductor stacked body is configured as a light source, and the semiconductor light emitting elements further include an optical system configured to project an image of the light source with a prescribed light distribution pattern, such that the semiconductor light emitting elements form a vehicle lighting unit.

3. The LED array of claim 1, wherein the first conductivity type is different from the second conductivity type.

4. A vehicle lighting unit, comprising:
    the LED array of claim 1; and
    an optical system configured to project an image of the light source with a prescribed light distribution pattern.

5. A method of manufacturing the LED array according to claim 1, comprising:
    preparing a growth substrate;
    growing a semiconductor stacked body on the growth substrate, the semiconductor stacked body having a first semiconductor layer of a first conductivity type, an active layer formed on the first semiconductor layer, and a second semiconductor layer of a second conductivity type formed on the active layer;
    forming a first bonding layer on the second semiconductor layer;
    dividing the semiconductor stacked body;
    preparing a support substrate;
    forming a second bonding layer on the support substrate, the second bonding layer having a side surface that forms an angle exceeding 90° with the upper surface thereof;
    placing the first and second bonding layers one above the other to bond the first and second bonding layers to each other, thereby forming a fusion layer;
    removing the growth substrate from the semiconductor stacked body;
    forming part of a side surface of the fusion layer including the side surface of the second bonding layer into a shape so as to form an angle exceeding 90° with the upper surface of the fusion layer; and
    forming an interconnection electrode so as to seamlessly extend from the first semiconductor layer to the side surface of the fusion layer.

6. The method of manufacturing a semiconductor light emitting element according to claim 5, wherein the forming part of a side surface of the fusion layer is etching; and the method further comprises, between growing a semiconductor stacked body and forming a first bonding layer, forming an etching stop layer at a position where the second semiconductor layer is exposed in the dividing the semiconductor stacked body step, the etching stop layer functioning in forming part of a side surface of the fusion layer.

7. The method of manufacturing a semiconductor light emitting element according to claim 5, wherein in forming an interconnection electrode, an insulating protective film is formed between the side surface of the fusion layer and the interconnection electrode formed on the side surface.

8. The method of manufacturing a semiconductor light emitting element according to claim 6, wherein in forming an interconnection electrode, an insulating protective film is formed between the side surface of the fusion layer and the interconnection electrode formed on the side surface.

9. The method of manufacturing a semiconductor light emitting element according to claim 5, wherein preparing, growing, forming a first bonding layer, dividing the semiconductor stacked body, preparing a support substrate, forming a second bonding layer, placing the first and second bonding layers, removing the growth substrate, forming part of a side surface of the fusion layer, and forming an interconnection electrode are executed consecutively.

\* \* \* \* \*